United States Patent
Taguchi (10) Patent No.: US 6,285,085 B1
(45) Date of Patent: Sep. 4, 2001

(54) SEMICONDUCTOR DEVICE, METHOD OF FABRICATING THE SAME AND STRUCTURE FOR MOUNTING THE SAME

(75) Inventor: Noboru Taguchi, Sayama (JP)

(73) Assignee: Citizen Watch Co., Ltd., Tokyo (JP)

(*) Notice: Subject to any disclaimer, the term of this patent is extended or adjusted under 35 U.S.C. 154(b) by 0 days.

(21) Appl. No.: 09/362,110

(22) Filed: Jul. 28, 1999

Related U.S. Application Data (63) Continuation-in-part of application No. 09/132,518, filed on Aug. 11, 1998.

(30) Foreign Application Priority Data

Aug. 13, 1997 (JP) .................................... 9-218526

(51) Int. Cl.$^7$ ........................... H01L 23/48; H01L 23/52; H01L 29/40
(52) U.S. Cl. ........................... 257/780; 257/737; 257/781
(58) Field of Search ................................ 257/737, 693, 257/738, 735, 773, 730, 780–784

(56) References Cited

U.S. PATENT DOCUMENTS

| | | | |
|---|---|---|---|
| 5,767,101 | * | 6/1998 | Mis et al. .............................. 438/614 |
| 5,793,117 | * | 8/1998 | Shimada et al. ..................... 257/780 |
| 5,898,223 | * | 4/1999 | Frye et al. ............................ 257/777 |
| 5,937,320 | * | 8/1999 | Andricacos et al. ................. 438/614 |

FOREIGN PATENT DOCUMENTS

| | | | |
|---|---|---|---|
| 52-7676 | * | 1/1977 | (JP) ..................................... 257/780 |
| 5-62980 | * | 3/1993 | (JP) ..................................... 438/614 |

\* cited by examiner

*Primary Examiner*—Jhihan B Clark
(74) *Attorney, Agent, or Firm*—Armstrong, Westerman, Hattori, McLeland & Naughton, LLP (57) ABSTRACT

Electrode pads are formed on a surface of a semiconductor chip, a first bumps are provided on lower electrodes provided on the electrode pads, and second bumps are provided outside the first bumps. The semiconductor chip has a side wall on one end side in a stepped shape and the first bumps and the second bumps are provided to extend from the surface to a side surfaces of the stepped portion of the semiconductor chip. Also, outer surfaces of the second bumps are formed to project outside from the side surface of the semiconductor chip.

7 Claims, 7 Drawing Sheets

SEMICONDUCTOR DEVICE, METHOD OF FABRICATING THE SAME AND STRUCTURE FOR MOUNTING THE SAME

This application is a C-I-P of Ser. No. 09/132,518 filed Aug. 11, 1998.

BACKGROUND OF THE INVENTION

1. Field of the Invention

The present invention relates to a semiconductor device with projection electrodes (bumps) which can be connected electrically and mechanically to a circuit substrate, a method of fabricating a semiconductor device for the same, and a structure for mounting the semiconductor device which electrically and mechanically connect the semiconductor device to the circuit substrate.

For the above-mentioned circuit substrate, a resin substrate made of a fiber glass reinforced epoxy or the like, a ceramic substrate, or a glass substrate or the like for constituting a liquid crystal display panel can be used.

2. Description of the Related Art

Figure 15:
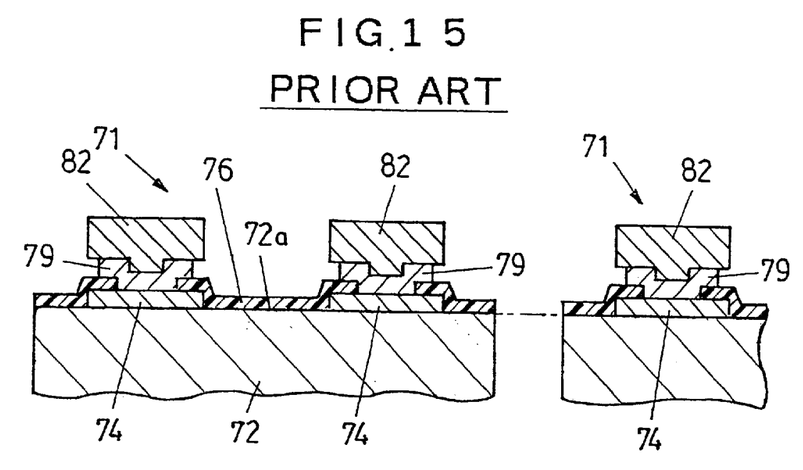
FIG. 15 is a sectional view showing an example of a conventional semiconductor device.

Conventionally, there exists a semiconductor device with bumps which can be connected electrically and mechanically to a circuit substrate, for example a semiconductor device 71 as shown in FIG. 15.

In the semiconductor device 71, multiple electrode pads 74 are formed on an upper surface 72a of a semiconductor chip 72, and the upper surface 72a is covered with an insulating film 76 leaving only the upper surfaces of the electrode pads 74 not covered. Lower electrodes 79 are formed above respective electrode pads 74. Bumps 82 formed in a substantially vertical straight-walled shape with respect to the upper surface 72a of the semiconductor chip 72 are provided above respective lower electrodes 79.

Next, a method of fabricating the semiconductor device 71 shown in FIG. 15 will be described with reference to FIG. 16 to FIG. 18 as well.

Figure 16:
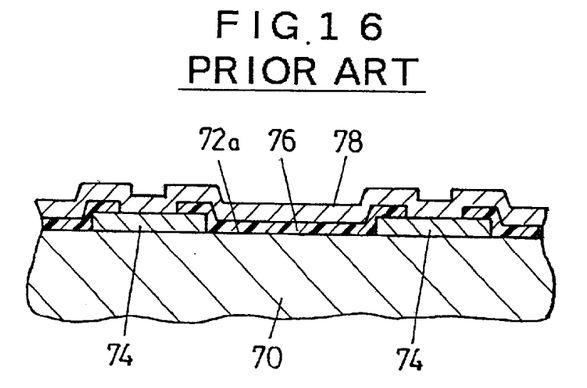
FIG. 16 is a sectional view for describing a step of forming a common electrode film performed when the semiconductor device shown in FIG. 15 is fabricated.

For fabricating the semiconductor device 71, the insulating film 76 is first formed over the entire surface of the semiconductor substrate 70 on which plural electrode pads are placed in lines in the direction perpendicular to the upper surface of the semiconductor substrate and thereby plural semiconductor chips are to be formed, as shown in FIG. 16.

Thereafter, the insulating film 76 is patterned to expose the upper surface of the electrode pads 74 with a photolithography treatment and an etching treatment.

Next, a common electrode film 78 is formed on the entire surface of the surface 70a of the semiconductor substrate 70, including on the insulating film 76 and on the electrode pads 74 with a sputtering process.

Incidentally, the common electrode film 78 is made by sequentially forming aluminum in a thickness of 0.8 μm, chromium at 0.01 μm, and copper at 0.8 μm, respectively, from the side of the semiconductor substrate 70.

The common electrode film 78 having such a multilayered structure serves as a connecting layer to the electrode pads 74 and a barrier layer for preventing interdiffusion, as well as an electrode used for forming bumps with a plating process.

Figure 17:
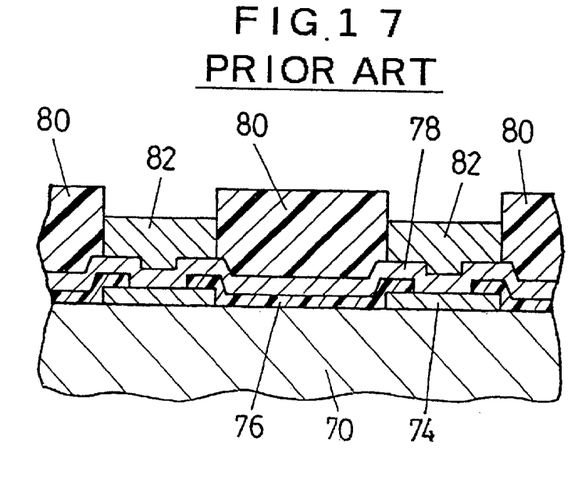
FIG. 17 is a sectional view for describing a step performed after the step shown in FIG. 16.

Next, as shown in FIG. 17, a photoresist 80 is formed over the entire surface of the common electrode film 78 in a thickness of 17 μm with a spin coating process. The photoresist 80 is patterned with a photolithography treatment by using a predetermined photomask to expose the photoresist 80 in an exposure apparatus and then performing a development treatment. By the patterning, the photoresist 80 exposes the common electrode film 78 to open each area in which a bump 82 is designed to be formed later.

Next, the bump 82, in straight-walled shape and having a thickness ranging from 10 μm to 15 μm, is formed in each opening of the photoresist 80 above the common electrode film 78 with a gold plating treatment which uses the common electrode film 78 as an electrode for plating.

Figure 18:
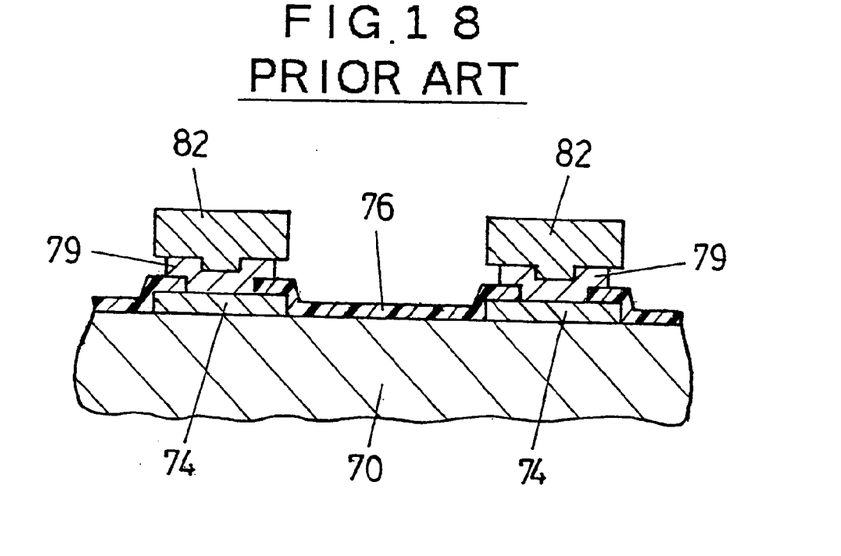
FIG. 18 is a sectional view for describing a step performed after the step shown in FIG. 17.

After the photoresist 80 is removed, each of the bumps 82 is used as a mask and the common electrode film 78 is etched with a wet etching process to form the lower electrodes 79 in areas aligned with the bumps 82 as shown in FIG. 18.

Finally, the semiconductor substrate 70 is processed by cutting (dicing) at the boundary parts between the adjacent semiconductor chips of semiconductor substrate 70 into single pieces of a semiconductor chip 72 as shown in FIG. 15, thus obtaining plural semiconductor devices 71.

Figure 19:
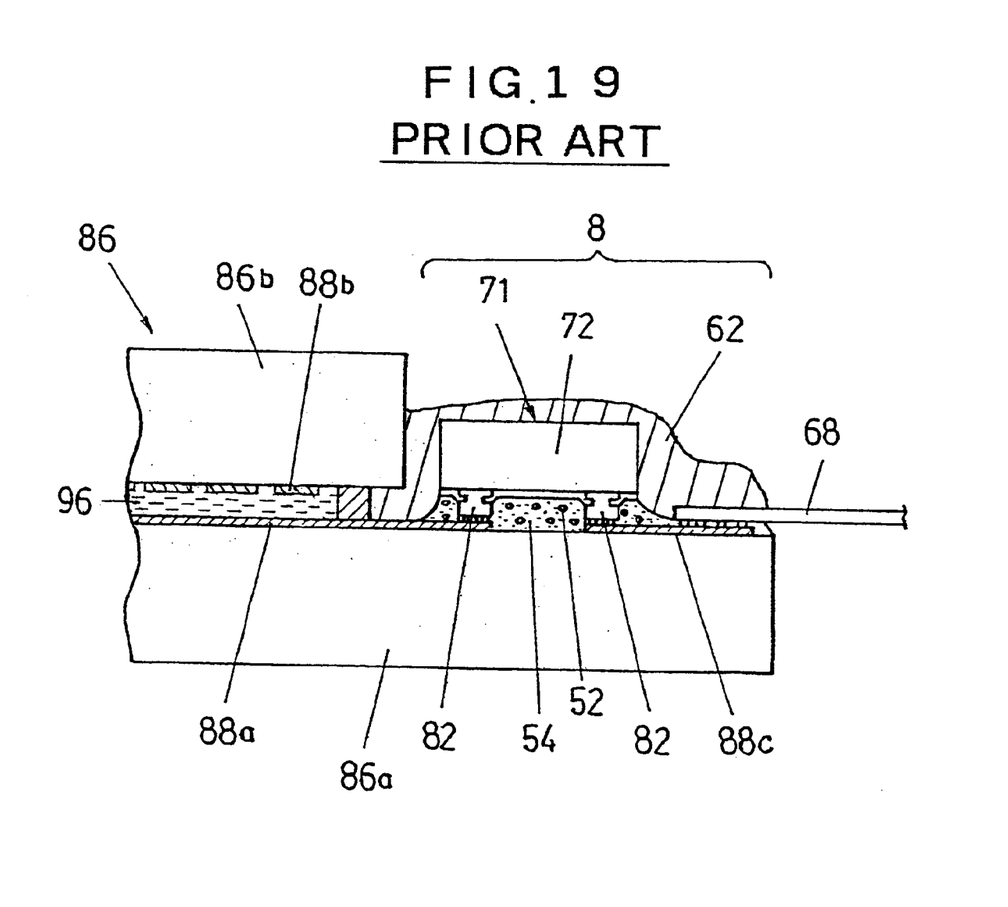
FIG. 19 is a sectional view for describing an example of a structure for mounting the conventional semiconductor device shown in FIG. 15 on a circuit substrate.

Incidentally, the wet etching is performed when the common electrode film 78 is etched to form the lower electrodes 79 as described in FIG. 18 and FIG. 19 for the following reasons.

Specifically, since the common electrode film 78 is formed in a three-layered structure consisting of aluminum in a thickness of 0.8 μm, chromium at 0.01 μm, and copper at 0.8 μm, respectively, from the side of the semiconductor substrate 72, the use of a dry etching process would need to use a composite etching gas as an etching gas used to obtain an etching selectivity of a layer being etched with respect to the other layers, thereby complicating the selection of the composite etching gas.

Also, the dry etching process is disadvantageous in industrial manufacturing since it takes a very long time for the etching. Furthermore, the dry etching process has a disadvantage in that expensive apparatuses used for the etching treatment are required.

According to the wet etching process however, an etchant allowing for good etching selectivity can be selected to conveniently perform the etching treatment without requiring large-scale equipments.

Next, an example of a conventional structure for mounting a semiconductor device to connect the semiconductor device 71 formed in accordance with the above-mentioned fabricating method to a circuit substrate will be described with reference to FIG. 19, with a liquid crystal display panel taken as an example.

In FIG. 19, portions other than the semiconductor device 71, glass substrates 86a, 86b of liquid crystal display panel 86, and a flexible printed circuit board (FPC) 68 are shown as a sectional view.

In a liquid crystal display panel 86 shown in FIG. 19, a liquid crystal 96 is filled between glass substrates 86a and 86b. A plurality of transparent electrodes 88a, 88b are provided on the opposite surface of the glass substrate 86a so as to run perpendicular with each other.

To mount the semiconductor device 71 above the glass substrate 86a which is the circuit substrate of the liquid crystal display panel 86, the semiconductor device 71 is disposed upside down with respect to the orientation shown in FIG. 15. The semiconductor device 71 is disposed with the bumps 82 thus located on the lower positions in alignment with the transparent electrode 88a on the glass substrate 86a.

At this point, an anisotropic conductive adhesive 54 is interposed between the bumps 82 and the glass substrate 86a.

Incidentally, the anisotropic conductive adhesive 54 is formed by mixing conductive particles 52 into an insulating adhesive.

In this manner, while the semiconductor device 71 is set on the glass substrate 86a of the liquid crystal display panel 86, concurrently with the semiconductor device 71 being pressed on the liquid crystal panel substrate 86a, a heating is performed therefor to connect each bump 82 electrically to the respective transparent electrodes 88a on the glass substrate 86a.

Furthermore, an FPC 68 is also disposed above the terminal electrode 88c formed on the right side in FIG. 19 on the glass substrate 86a such that an anisotropic conductive adhesive 54 having the conductive particles 52 mixed therein is interposed between the FPC 68 and the terminal electrode 88c. While the FPC 68 is pressed on the glass substrate 86a, heating is performed therefor.

The FPC 68 is a film patterned with a copper wiring electrode for transmitting electrical power and providing an input signal to the semiconductor device 71.

The above-mentioned structure holds the conductive particles 52 of the anisotropic conductive adhesive 54 between the bumps 82 and the transparent electrodes 88a and between the FPC 68 and the terminal electrode 88c, respectively, which provides an electrical connection between the bumps 82 and the transparent electrodes 88a and between the copper wiring electrode on the FPC 68 and the terminal electrode 88c as well as a mechanical connection thereof using the insulating adhesive.

Thereafter, as shown in FIG. 19, a mold resin 62 is applied onto the semiconductor device 71, the upper surface of the flexible film 68, and the periphery thereof. The mold resin 62 prevents moisture from entering each of the connections between the bumps 82 and the transparent electrodes 88a and the connection between the copper wiring electrode on the FPC 68 and the terminal electrode 88c, and also provides mechanical protection, thereby improving reliability.

However, the above-mentioned conventional semiconductor device and the structure for mounting the same on the circuit substrate have a disadvantage in that a large area is occupied to mount the semiconductor device on the circuit substrate.

Thus, it is difficult to reduce the circuit substrate to which the semiconductor device is connected, in size.

For example, a connecting area 8 for connecting the semiconductor device 71 above the glass substrate 86a of the liquid crystal display panel 86 to the FPC 68 as shown in FIG. 19 is required to have a width of approximately 5 mm since the semiconductor device 71 has a width of 2 mm and requires a margin for connection of 1 mm and the flexible film 68 requires a margin for connection of 2 mm.

The portion of the glass substrate 86a at which the semiconductor device 71 and the flexible film 68 are connected is a portion which serves as a non-displaying region of the liquid crystal panel. Thus, the above-mentioned conventional structure has a disadvantage in that the area of the non-displaying region is very large with respect to the area of the displaying region.

In other words, a larger area is occupied to mount the semiconductor device and the FPC onto the liquid crystal display panel.

SUMMARY OF THE INVENTION

It is an object of the present invention to provide a semiconductor device, a method of fabricating the same, and a structure for mounting the same, which solve the disadvantage possessed by the above-mentioned conventional semiconductor device and the structure for mounting the same on a circuit substrate, and more specifically, to reduce the area of a connection required for connecting the semiconductor device and FPC to a circuit substrate, thereby enabling a reduction in size of the circuit substrate and a liquid crystal display panel module.

To achieve the above-mentioned object in the present invention, a semiconductor device is provided having a semiconductor chip; electrode pads formed on an upper surface of the semiconductor chip; an insulating film covering the upper surface of the semiconductor chip leaving the surface of the electrode pads not covered; lower electrodes provided to extend over both the electrode pads and a side surface of the semiconductor chip; and bumps provided on the lower electrodes.

According to the semiconductor device, the lower electrodes are provided to extend over both the electrode pads and the side surface of the semiconductor chip and the bumps are provided on the lower electrodes so that a portion of the bumps extending over the side surface can be used to connect to electrodes of a circuit substrate. Thus, the side surface of the semiconductor device can be used as a surface for connecting to the circuit substrate, thereby making it possible to substantially reduce the area for connection.

The semiconductor chip can have a side wall in a stepped shape. Thus, when the bumps of the semiconductor device are electrically connected to the electrodes on the circuit substrate, the side surface of the semiconductor chip, which is provided with the bumps, has only to be directly contacted with the planar circuit substrate to easily and reliably make a connection.

The bumps can include a plurality of metal layers.

Also, the bumps can be formed to have a shape protruding outside the side surface of the semiconductor chip. Thus, the connection of the bumps of the semiconductor device to the circuit substrate becomes easier and more reliable.

The bumps can be formed of solder. Thus, when the semiconductor device is connected to the electrodes of the circuit substrate, the solder can reliably connect and fix the semiconductor device to the circuit substrate merely by heating at a temperature which causes the melting of the solder in a state where the bumps are contacted with the electrodes of the circuit substrate.

In addition, a method of fabricating the semiconductor device according to the present invention can be performed having the steps of a first dicing step of grooving at boundary parts between the adjacent semiconductor chips of a semiconductor substrate having multiple electrode pads formed in lines thereon for forming a plurality of semiconductor chips to leave the semiconductor substrate at a predetermined thickness and forming street lines; forming a common electrode film over the entire surface of the semiconductor chips; forming a photoresist on the common electrode film and patterning the photoresist to form openings for forming bumps in predetermined areas from the electrode pads extending to the street lines; forming bumps in the openings of the photoresist on the common electrode film; removing the photoresist, etching the common electrode film using the bumps as masks; and a second dicing step of cutting the street line of the semiconductor substrate at a processing width smaller than that in the first dicing.

In this method, the semiconductor device can be fabricated relatively easily.

Also, said method of fabricating the semiconductor device having the additional step of plating surfaces of the bumps after the second dicing step may be performed.

Said method of fabricating the semiconductor device having the additional step of reflowing the bumps in a spherical shape after the second dicing step may be performed.

Furthermore, as a structure for mounting a semiconductor device to connect the semiconductor device according to the invention to the circuit substrate, the side surface, on which bumps are provided, of semiconductor chip constituting the semiconductor device, is connected opposite to the circuit substrate, and the bumps and electrodes on a circuit substrate are electrically connected.

In the structure for mounting the semiconductor device, an FPC may be connected to a side surface opposite or perpendicular to a side surface of the semiconductor chip connected to the circuit substrate, so that the bumps formed thereon and the electrodes on the FPC are electrically connected.

The above and other objects, features and advantages of the invention will be apparent from the following detailed description which is to be read in conjunction with the accompanying drawings.

DETAILED DESCRIPTION OF THE PREFERRED EMBODIMENTS

In the following, best embodiments of a semiconductor device according to the present invention and embodiments of a method of fabricating the semiconductor device and a structure for mounting the same will be described based on the accompanying drawings.

Figure 1:
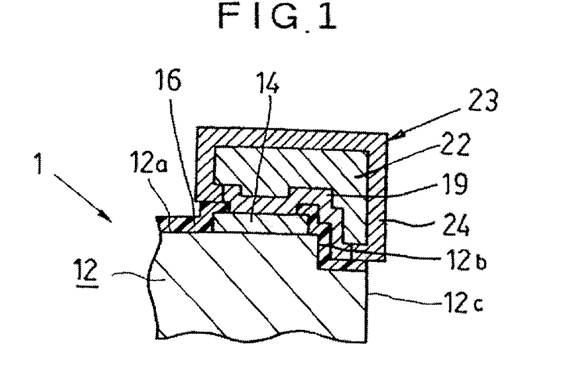
FIG. 1 is a sectional view showing a primary constituent of an embodiment of a semiconductor device according to the present invention.
Figure 2:
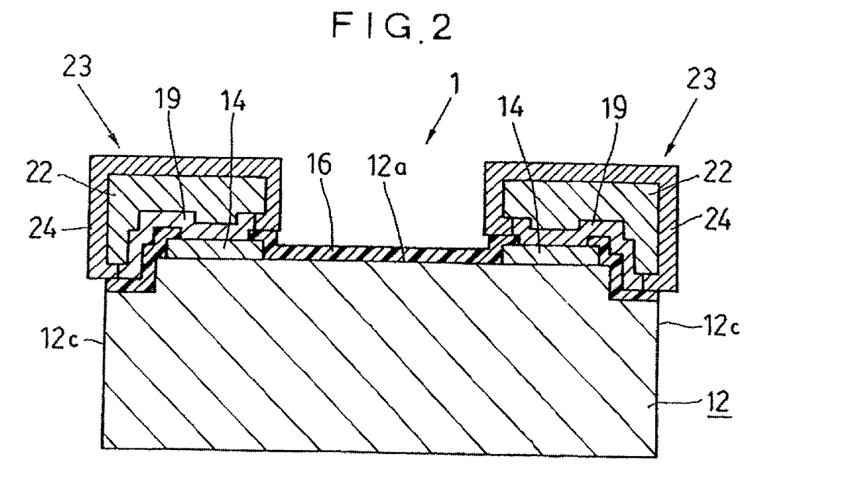
FIG. 2 is a sectional view showing the overall shape of the semiconductor device.

Description of a Structure of a Semiconductor Device According to the Present Invention: FIG. 1 and FIG. 2.

First, a structure of a semiconductor device according to the present invention will be described using FIG. 1 and FIG. 2. FIG. 1 is a sectional view showing a primary constituent of a semiconductor device according to the present invention, and FIG. 2 is a schematic sectional view showing the overall shape of the semiconductor device.

The semiconductor device 1 has a semiconductor chip 12; electrode pads 14 formed on a surface 12a of the semiconductor chip 12; an insulating film 16 covering the edges of the electrode pads 14; and lower electrodes 19 formed on the electrode pads 14 and on a side wall of the semiconductor substrate 12.

First bumps 22 are provided on the lower electrodes 19 and second bumps 24 are provided on surfaces of the first bumps 22, thus forming bumps 23 in a plurality of layers.

The semiconductor chip 12 has a side wall, shown as the right end surface in FIG. 1, formed in a stepped shape. The first bumps 22 and the second bumps 24 are provided so as to extend over both a surface 12a and a side surface 12b of the stepped portion of the semiconductor substrate 12.

The right edges of the second bumps 24 are formed to project from a projecting side surface 12c of the stepped portion of the semiconductor chip 12 by a length ranging from 1 to 10 μm.

The lower electrodes 19 serves as leading line which electrically connect the electrode pads 14 to the side surface of the semiconductor chip 12. The bumps 23 consisting of the first bumps 22 and the second bumps 24 serve as electrodes for connection, i.e. for connecting a semiconductor device 1 to a circuit substrate.

Incidentally, the bumps 23 can be formed of a single metal, hardly oxidized, such as gold (Au).

Description of a Method of Fabricating the Semiconductor Device According to the Present Invention: FIG. 2 to FIG. 10.

Next, a method of fabricating a semiconductor device 1 having a shape as shown in FIG. 2 will be described.

Figure 3:
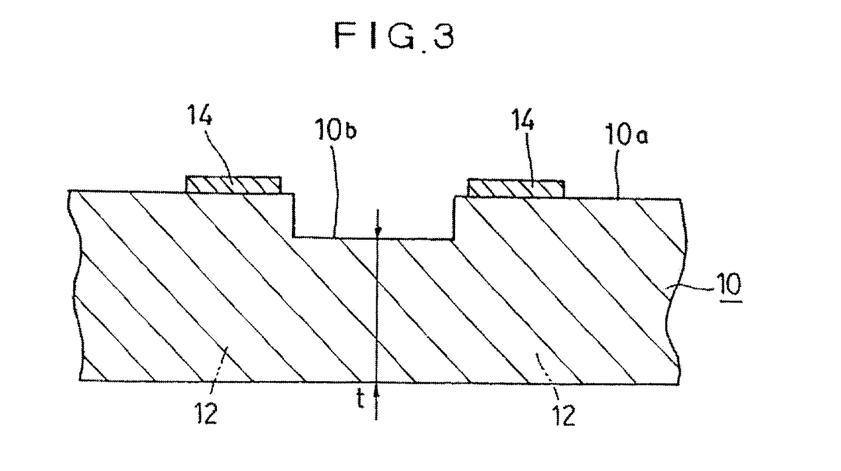
FIG. 3 is a sectional view showing a semiconductor substrate for describing a first grooving step performed to fabricate the semiconductor device.

First, as shown in FIG. 3, the semiconductor substrate 10 (wafer), formed thereon with an integrated circuit (omitted in FIG. 3) having active elements and passive elements for multiple semiconductor chips, and multiple electrode pads 14 for connecting it to an external circuit, is subjected to a first grooving step (dicing step) at boundary parts between the adjacent semiconductor chips 12, and formed a street line 10b.

The grooving step of the semiconductor substrate 10 is performed such that a thickness t of a portion of the semiconductor substrate 12 left after the grooving is in the range from 200 μm to 300 μm.

Figures 4, 5:
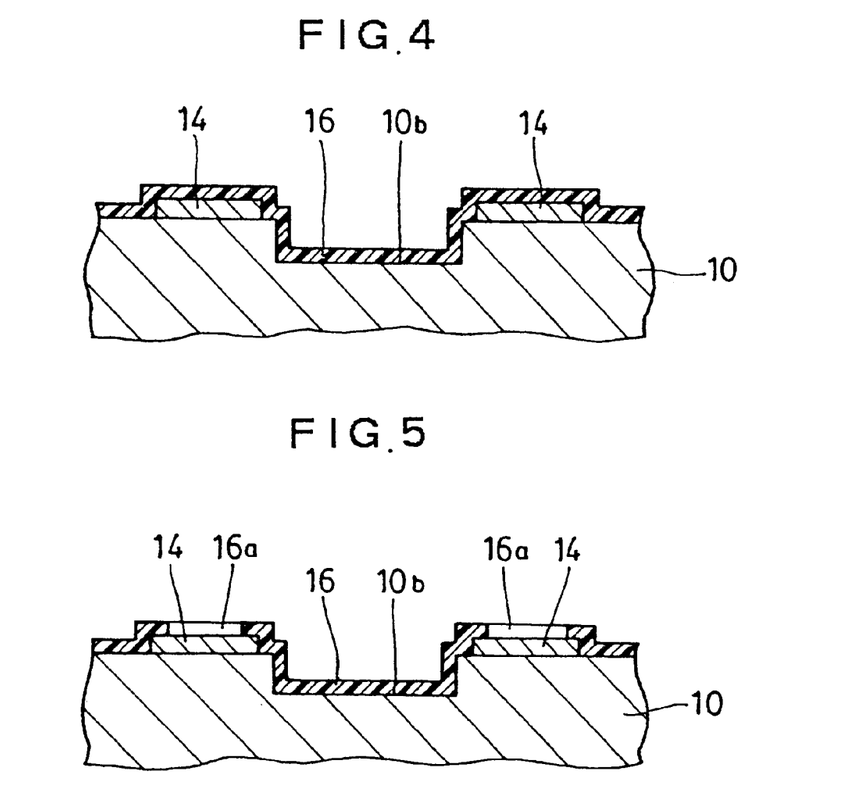
FIG. 4 is a sectional view for describing a step of forming an insulating film performed to fabricate the semiconductor device.
FIG. 5 is a sectional view for describing a step of patterning the insulating film.

Next, the insulating film 16 made of photosensitive polyimide is formed over the entire surface of the semiconductor substrate 10 in a thickness ranging from 2 μm to 3 μm with a spin coating process as shown in FIG. 4.

For the insulating film 16, a silicon oxide film containing boron or phosphorus, or both boron and phosphorus, can be formed with a chemical vapor deposition (CVD) process other than the photosensitive polyimide. Alternatively, a silicon nitride film can be formed with a plasma chemical vapor deposition (plasma CVD) process.

Thereafter, the photosensitive polyimide layer is subjected to an exposure treatment using a predetermined photomask and then to a development treatment. Thus, the insulating film 16 is patterned to form an opening 16a on each electrode pad 14 as shown in FIG. 5 as well as cover the edges of the electrode pad 14 with the insulating film 16.

Figure 6:
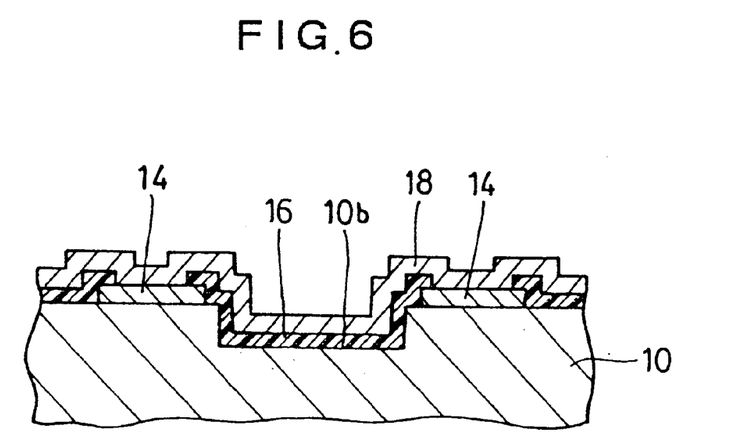
FIG. 6 is a sectional view for describing a step of forming a common electrode film performed after the step shown in FIG. 5.

Next, as shown in FIG. 6, films are subsequently formed of aluminum in a film thickness of 0.8 μm, chromium in a film thickness of 0.01 μm, and then copper in a film thickness of 0.8 μm with a sputtering process over the entire surface of semiconductor substrate 10, including the insulating film 16 and the electrode pads 14, thereby forming a common electrode film 18 having a three-layered structure.

Incidentally, for the common electrode film 18 as shown in FIG. 6, it is necessary to use an electrode material which has a favorable electrical conductivity and a good mechanical contact to the electrode materials forming the electrode pads 14 and the first bumps 22 (see FIG. 2), and that is stable without interdiffusion of the electrode materials.

For this reason, a two-layered structure such as titanium-palladium, titanium-gold, titanium- platinum, alloy of titanium and tungsten-palladium, alloy of titanium and tungsten-gold, alloy of titanium and tungsten-platinum, alloy of titanium and tungsten-copper, chromium-copper, or a three-layered structure of aluminum-titanium-copper and the like is effective other than the above-mentioned three-layered structure made of aluminum, chromium and copper for the common electrode film 18.

Figure 7:
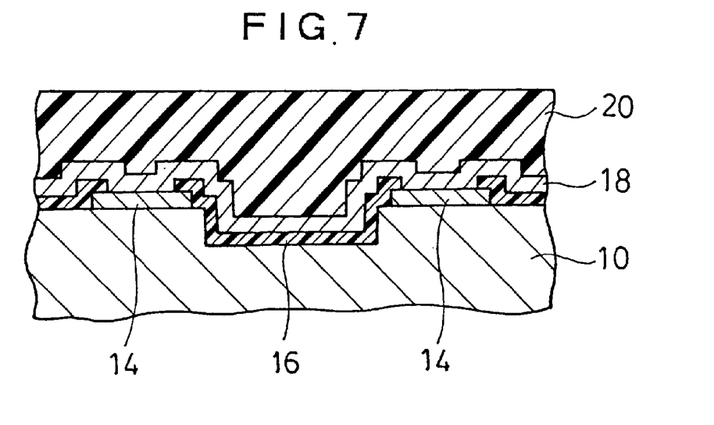
FIG. 7 is sectional view for describing a step of forming a photoresist on the common electrode film after the step shown in FIG. 6.

Thereafter, as shown in FIG. 7, a photoresist 20 is formed over the entire surface of the common electrode film 18 in a thickness of 17 μm with the spin coating process. The photoersist 20 is patterned by performing an exposure treatment using a predetermined photomask and then performing a development treatment to form openings for forming bumps in the areas from the electrode pads 14 extending to the street lines 10b.

Figure 8:
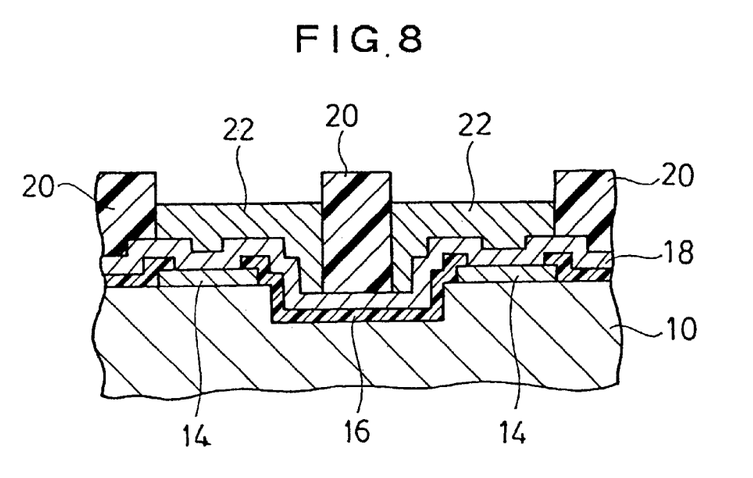
FIG. 8 is a sectional view for describing a step of leaving predetermined portions of the photoresist.

Next, the photoresist 20 is used as a plating mask to perform copper plating in a thickness ranging from 10 μm to 15 μm, thereby forming the first bumps 22 in the respective openings of the photoresist 20 on the common electrode film 18, as shown in FIG. 8.

Incidentally, for the first bumps 22 formed here, a gold, nickel structure can be used for the material thereof.

Figure 9:
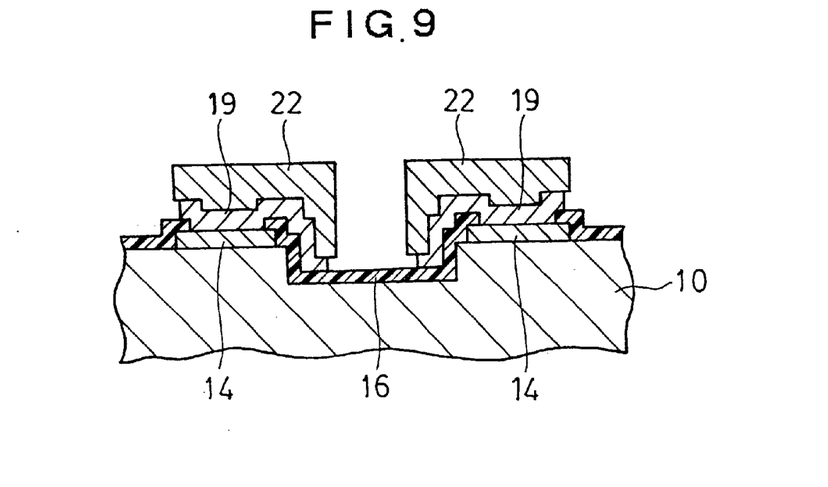
FIG. 9 is a sectional view for describing a step of forming lower electrodes after the step shown in FIG. 8.

Thereafter, as shown in FIG. 9, a wet stripper is used to remove the photoresist 20 used as the plating mask. Additionally, each of the first bumps 22 is used as an etching mask to perform etching with Enstrip C (product name), a copper etchant manufactured by Meltex Corp., thereby removing an area of the copper of the uppermost layer of the common electrode film 18 that is exposed out by the first bumps 22.

Incidentally, the etching treatment is performed for an over-etching time 30% longer than just (normal) etching time.

Next, a mixed solution of ammonium cerium nitrate and potassium ferricyanide and sodium hydroxide is used to etch the chromium (intermediate layer) serving as a barrier layer and contact layer and the aluminum (lowermost layer) of the common electrode film 18.

Incidentally, the etching treatment is performed for an over-etching time 30% longer than just etching time to remove unnecessary portions of the common electrode film 18 so that each of the lower electrodes 19 is formed in an area aligned with each of the first bump electrodes 22.

Figure 10:
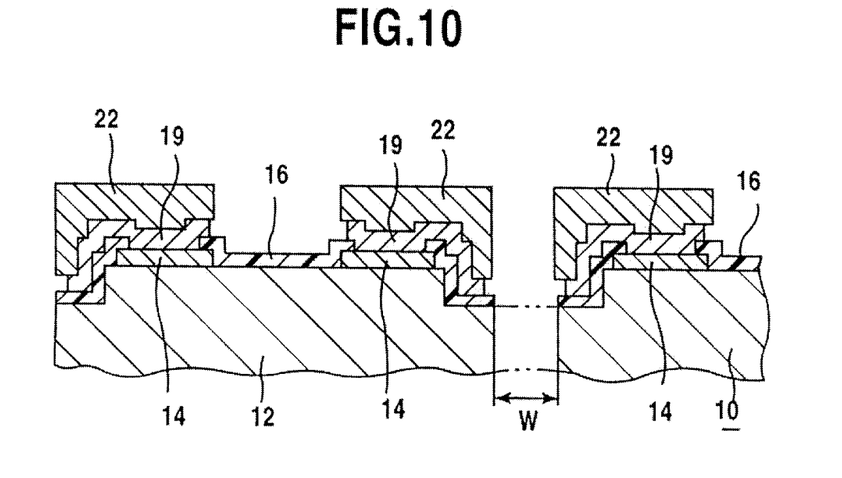
FIG. 10 is a sectional view showing a state of the semiconductor device being cut into a semiconductor chip after the step shown in FIG. 9.

Next, a portion of the street lines 10b of the semiconductor substrate 10, the thickness of which has been reduced in the first grooving step described in FIG. 3, is cut in a second grooving step (dicing step). The semiconductor substrate 10 is thus cut into a plurality of single pieces of semiconductor chips 12 as shown in FIG. 10.

At this point, a cut width W for the second grooving step is smaller than the cut width for the first grooving step by approximately 30 μm to 50 μm.

Thereafter, as shown in FIG. 2, gold is plated over the entire exposed surfaces of the first bumps 22 in a thickness ranging from 2 μm to 3 μm with an electroless plating process to form the second bumps 24.

The second bumps 24 can be of a two-layered structure made of nickel and gold, or a single layer structure made of gold.

After these steps are sequentially performed, the semiconductor device 1, having the bumps 23 formed to extend over both the surface 12a and the side surface 12c of the semiconductor substrate 12, is obtained.

Figure 11:
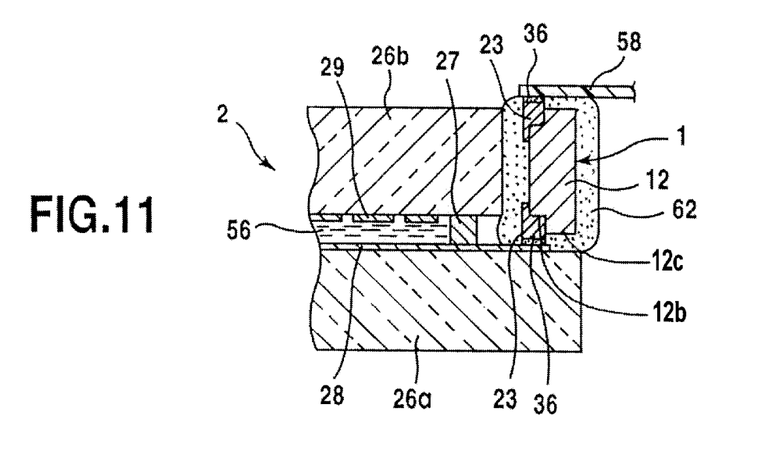
FIG. 11 is a sectional view for describing an example of a structure for mounting the semiconductor device shown in FIG. 2 on a circuit substrate.

Description of a Structure for Mounting the Semiconductor Device on a Circuit Substrate: FIG. 11

Next, a structure for mounting the semiconductor device 1 shown in FIG. 2 on a circuit substrate will be described.

As shown in FIG. 11, when the semiconductor device 1 according to the present invention is mounted on a liquid crystal panel 2 in which a liquid crystal 56 sealed in with sealing agent 27 is sandwiched between two glass substrates 26a and 26b having transparent electrodes 28, 29 on respective surfaces thereof, facing each other, the semiconductor device 1 is disposed with the side surfaces 12c in upper and lower positions respectively.

An anisotropic conductive adhesive 36 is interposed between the lower surfaces of the lower bumps 23 (shown simplified) of the semiconductor device 1 in FIG. 11 and a transparent electrodes 28 provided on the upper surface of the glass substrate 26a which is the lower circuit substrate such that the side surface 12b of the semiconductor device 1 and the circuit substrate 2 are disposed opposite to each other.

The anisotropic conductive adhesive 36 is interposed between the upper second bumps 23 (shown simplified) in FIG. 11 and an FPC 58. The FPC 58 is a film patterned with a copper wiring electrode to provide a power supply for driving the semiconductor device 1 and an input signal.

The anisotropic conductive adhesive 36 is an adhesive formed by dispersing conductive particles in an insulating adhesive and is conductive in the thickness direction between opposite surfaces and it is insulating in the lateral direction.

The FPC 58 is pressed to the glass substrate 26a. Specifically, a pressure of 400 kg/cm² is applied to the second bumps 23 and the transparent electrode 28, and to the FPC 58 and the bumps 23, respectively. At the same time, heating is performed at a temperature ranging from 180° C. to 220° C.

Thus, the lower bumps 23 and the transparent electrodes 28 as well as the upper bumps 23 and the copper wiring electrode on the FPC 58 can be electrically connected by the conductive particles in the anisotropic conductive adhesive 36. Also, the semiconductor device 1 and the glass substrate 26a as well as the semiconductor device 1 and the FPC 58 can be mechanically connected by the insulating agent.

In addition, a mold resin 62 is formed around the semiconductor device 1 to prevent moisture from entering the above-mentioned respective connections and provide good mechanical protection, thereby improving reliability.

For the anisotropic conductive agent 36, a mixture is used which is formed by mixing a conductive material in a bead shape with an outer diameter ranging from 4 $\mu$m to 6 $\mu$m made by a two-layer plating of nickel-gold on a surface of a spherical plastic, approximately 40% in volume ratio, into a thermosetting type epoxy base adhesive serving as an insulating adhesive.

In the example shown in FIG. 11, the FPC 58 is bonded on the side surface of the upper surface of a semiconductor chip 12 having bumps 23 formed thereon. The FPC 58, however, may be connected to the side surface of the semiconductor chip 12 perpendicular to the glass substrate 26a, what is to say, the bumps 23 are provided on the side surface of the semiconductor chip 12, that is the confronting paper surface, and the FPC 58 may be connected with the side surfaces of the semiconductor chip 12, as shown in FIG. 11.

In this manner, by mounting the side surfaces 12c in upper and lower positions respectively, the semiconductor device 1 can be mounted on the glass substrate 26a with a portion of the bumps 23 parallel to the side surface 12b in the thickness direction of the semiconductor device 1. Thus, the area occupied for mounting the semiconductor device can be substantially reduced as compared with the prior art to enable a reduction in size of the liquid crystal panel 2, thereby allowing the semiconductor devices to be mounted on the liquid crystal panel 2 at a higher density.

Next, another embodiment of the semiconductor device, the method of fabricating the same, and the structure for mounting the semiconductor device according to the present invention will be described with reference to FIG. 12 to FIG. 14.

Figure 12:
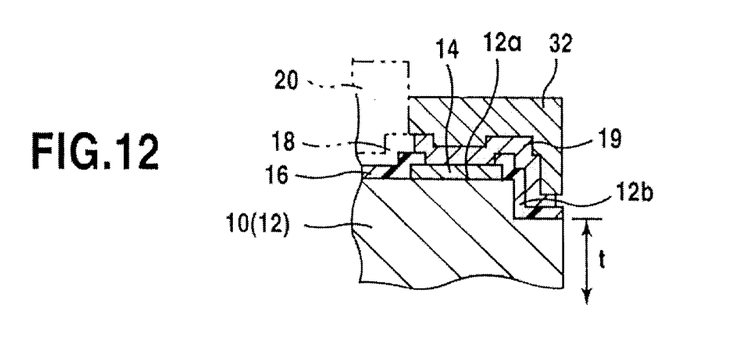
FIG. 12 is a sectional view showing another embodiment of the semiconductor device according to the present invention.
Figure 14:
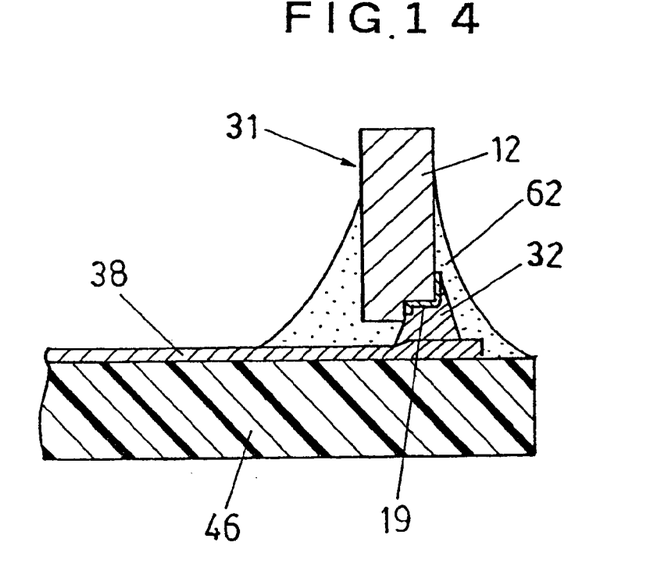
FIG. 14 is a sectional view for describing an example of a structure for mounting the semiconductor device shown in FIG. 13 on a circuit substrate.

Incidentally, portions corresponding to those in FIG. 1 to FIG. 11 are designated by the same reference numerals and symbols in FIG. 12 to FIG. 14 and the description thereof is omitted.

Another Embodiment of the Semiconductor Device and the Method of fabricating the same According to the Present Invention: FIG. 12 and FIG. 13

As shown in FIG. 12, street lines of a semiconductor substrate 10 are subjected to a first grooving step (dicing step) such that a thickness t of the portion of the substrate left after the grooving is in the range from 200 $\mu$m to 300 $\mu$m, similarly to the case described using FIG. 3 to FIG. 5 in the above-mentioned embodiment.

Next, an insulating film 16 made of photosensitive polyimide is formed in a thickness ranging from 2 $\mu$m to 3 $\mu$m over the entire upper surface of the semiconductor substrate 10. An exposure treatment using a predetermined photomask and a development treatment are then performed to pattern the insulating film 16 so as to open the electrode pads 14.

Incidentally, for the insulating film 16, silicon nitride film can be formed in a thickness ranging from 2 $\mu$m to 3 $\mu$m with a plasma chemical vapor deposition process instead of the photosensitive polyimide. Alternatively, a silicon dioxide film including boron or phosphorus, or both boron and phosphorus can be formed with a chemical vapor deposition process.

Additionally, for the insulating film 16, an inorganic film can be used such as tantalum oxide or aluminum oxide other than silicon nitride or silicon dioxide. Furthermore, the insulating film 16 can be formed in a multi-layered structure of the above-mentioned inorganic film and organic film.

The method of forming the insulating film 16 can utilize a sputtering process other than the above-mentioned plasma chemical vapor deposition process and the chemical vapor deposition process.

Over the entire surface of the insulating film 16 thus formed, films are subsequently formed of aluminum in a film thickness of 0.8 $\mu$m, chromium in a film thickness of 0.01 $\mu$m, and copper in a film thickness of 0.8 $\mu$m with a sputtering process to form a common electrode film 18 (later formed into a lower electrode 19) in a three-layered structure.

For the common electrode film 18, a two-layered structure such as titanium-palladium, titanium-gold, titanium-platinum, alloy of titanium and tungsten-palladium, alloy of titanium and tungsten-gold, alloy of titanium and tungsten-platinum, alloy of titanium and tungsten-copper, chromium-copper, or a three-layered structure made of aluminum-titanium-copper and the like can be used.

A photoresist 20 is formed in a thickness ranging from 20 $\mu$m to 30 $\mu$m over the entire surface of the common electrode film 18 similarly to the case described in FIG. 7. An exposure treatment using a predetermined photomask and then a development treatment are performed to pattern the photoresist 20 so as to form an opening in an area thereof in which bumps 32 are intended to be formed.

Next, similarly to the case described in FIG. 8, the photoresist 20 is used as a plating mask to perform solder plating in a thickness ranging from 15 $\mu$m to 20 $\mu$m, thereby forming the bumps 32 in the opening of the photoresist 20 (only the one side of the photoresist is shown by a imaginary line since the illustration is simplified in FIG. 12) on the common electrode film 18.

Such fabricating steps cause the bumps 32 to be formed to extend over both a surface 12a and a side surface 12b of the semiconductor 12 on the common electrode film 18.

Incidentally, for the solder plating solution used here, a plating solution having the composition of 60% tin and 40% lead after plating is selected.

After the bumps 32 are formed, the photoresist 20 used as a plating mask is removed using a wet stripper. Additionally, etching is performed similarly to the case in the embodiment described in FIG. 9 by using the bumps 32 as an etching mask to remove an area of copper of the uppermost layer of the common electrode film 18 that is exposed out of the bumps 32.

The etching treatment at this point is similar to the case described in FIG. 9 in that it is performed for an over-etching time 30% longer than just (normal) etching time.

Next, a mixed solution of ammonium cerium nitrate and potassium ferricyanide and sodium hydroxide is used to etch the chromium (intermediate layer), serving as a barrier layer and a contact layer, and the aluminum (lowermost layer) of the common electrode film 18.

This etching treatment is also performed for an overetching time 30% longer than the just etching time to remove unnecessary portions of the common electrode film 18, thereby forming the lower electrode 19 in an area aligned with the bumps 32.

Next, similarly to the case described in FIG. 10, a second grooving step (dicing step) is performed at a cut width W to cut a portion of the semiconductor substrate 10, the thickness of which has been reduced at the first grooving step. Thus, the semiconductor substrate 10 is cut into each single piece of semiconductor chip.

Incidentally, this embodiment is similar to the embodiment described in FIG. 1 to FIG. 11 in that the cut width W for the second grooving step is smaller than the cut width for the first grooving step by approximately 30 μm to 50 μm.

Figure 13:
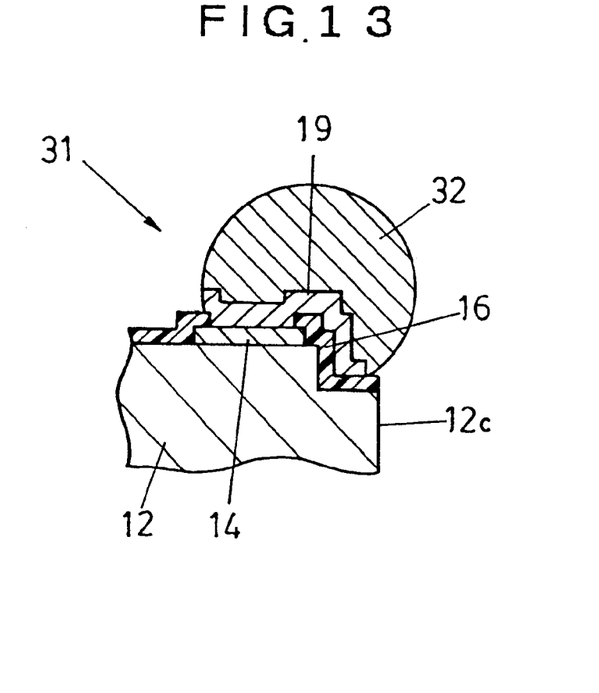
FIG. 13 is a sectional view for describing a step of reflowing a bump formed of solder of the semiconductor device shown in FIG. 12 into a spherical shape.

Next, as shown in FIG. 13, the semiconductor chip 12 being in a single piece state is heated at a temperature ranging from 230° C. to 250° C. to melt the solder, causing the bumps 32 to be rounded due to surface tension.

In this case, the rightmost portion of the rounded bumps 32 are positioned to project 1 μm to 10 μm to the right in FIG. 13 with respect to a side surface 12c, i.e., the right end surface of the semiconductor chip 12.

In this manner, the semiconductor device 31 can be formed using the solder for the bumps 32.

Structure for Mounting the Semiconductor Device According to Another Embodiment: FIG. 14

Next, a structure for mounting the semiconductor 31 shown in FIG. 13 on a circuit substrate will be described.

When the semiconductor device 31 shown in FIG. 13 is mounted on a circuit substrate 46, the semiconductor 31 (shown simplified) is disposed such that a side surface thereof is at a lower position and the bumps 32 are positioned on electrodes 38 of the circuit substrate 46 as shown in FIG. 14.

When heating is performed at a temperature ranging from 230° C. to 250° C. with the above-mentioned condition maintained, the solder of the bumps 32 become molten. Thus, the molten solder is deposited on the electrodes 38 and then cooled to thereby fix the semiconductor device 31 to the electrodes 38.

Thereafter, a region near connections of the bumps 32 and the electrodes 38, including the portion of the semiconductor device 31, is coated with a mold resin 62 to reinforce the connection. The protective agent 62 also improves reliability for electrical conductivity and mechanical connectability.

In this manner, since the bumps 32 are formed with solder plating in this embodiment, bumps 32 having the protruding portion with respect to the side surface 12c of the semiconductor chip 12 can be easily formed.

Also, the bumps 32 can be molten during a heating reflow step at a temperature ranging from 230° C. to 250° C. so that the semiconductor device 31 can be easily fixed to the circuit substrate 46.

Additionally, if a reflow step is again performed at a temperature ranging from 230° C. to 250° C., the reliability for electrical conductivity and mechanical connectability can be further improved for the connection of the semiconductor device 31 to the circuit substrate 46.

The semiconductor device in the above-mentioned embodiments is described in connection with the structure for mounting the same to a liquid crystal display panel. The structure for mounting the semiconductor device, however, is applicable for mounting the semiconductor device to a resin substrate, a ceramic substrate and the like.

Effect of the Invention

As described above, according to the semiconductor device and the structure for mounting the same according to the present invention, the lower electrodes are provided to extend over both the electrode pads and the side surface of the semiconductor chip and the bumps are provided on the lower electrodes so that the semiconductor device can be connected to the circuit substrate on the surface provided with the bumps, which is the side surface of the semiconductor device. Thus, the connecting area used to connect the semiconductor device to the circuit substrate can be reduced.

Therefore, the semiconductor device can be mounted on a liquid crystal display device or a circuit substrate and the like at a higher density. Moreover, a higher reliability can be obtained in terms of electrical conductivity and mechanical connectability of the connection.

In addition, when the semiconductor device is applied to a liquid crystal display device, the area for a frame can be narrowed to provide a reduction in the size of a glass substrate.

Furthermore, when the method of fabricating the semiconductor device according to the present invention is performed, the semiconductor device can be relatively easily fabricated without a substantial change in steps as compared with the conventional method of fabricating a semiconductor device.

What is claimed is:

1. A semiconductor device comprising:

a semiconductor chip having a stepped side wall on a side surface;

electrode pads formed on an upper surface of said semiconductor chip;

an insulating film covering the upper surface and the stepped side wall of said semiconductor chip leaving surfaces of the electrode pads not covered;

lower electrodes provided to extend over both said electrode pads and the stepped side wall of said semiconductor chip; and bumps provided on said lower electrodes.

2. The semiconductor device according to claim 1, wherein said bumps include a plurality of metal layers.

3. The semiconductor device according to claim 1, wherein said bumps have a shape protruding outside the side surface of said semiconductor chip.

4. The semiconductor device according to claim 1, wherein said bumps are formed of solder.

5. A structure for mounting a semiconductor device for connecting the semiconductor device comprising a semiconductor chip having a stepped side wall on a side surface, electrode pads formed on an upper surface of said semiconductor chip, an insulating film covering the upper surface and the stepped side wall of said semiconductor chip leaving the surface of the electrode pads not covered, lower electrodes provided to extend over both said electrode pads and the stepped side wall of said semiconductor chip, and bumps provided on said lower electrodes to a circuit substrate, wherein the side surface of the semiconductor chip is connected opposite to the circuit substrate, and the bumps and the electrodes on the circuit substrate are electrically connected.

6. The structure for mounting a semiconductor device according to claim 5, wherein a flexible printed circuit board (FPC) is connected to the side surface of said semiconductor chip opposite to the side surface connected to said circuit substrate, the bumps formed on the side surface and the electrodes on the FPC are electrically connected.

7. The structure for mounting a semiconductor device according to claim 5, wherein a flexible printed circuit board (FPC) is connected to the side surface of said semiconductor chip perpendicular to the side surface connected to said circuit substrate, the bumps formed thereon and the electrodes on the FPC are electrically connected.

* * * * *